United States Patent
Kim

Patent Number: 5,998,840
Date of Patent: Dec. 7, 1999

[54] SEMICONDUCTOR-ON-INSULATOR FIELD EFFECT TRANSISTORS WITH REDUCED FLOATING BODY PARASITICS

[75] Inventor: Il-Kwon Kim, Kyunggi-do, Rep. of Korea

[73] Assignee: Samsung Electronics Co., Ltd., Rep. of Korea

[21] Appl. No.: 09/148,689

[22] Filed: Sep. 4, 1998

[30] Foreign Application Priority Data

Sep. 4, 1997 [KR] Rep. of Korea .................. 97-45863

[51] Int. Cl.[6] .................................................. H01L 27/01
[52] U.S. Cl. ........................ 257/349; 257/345; 257/347
[58] Field of Search .................................. 257/345, 347, 257/349, 350, 351; 438/164, 406, 311

[56] References Cited

U.S. PATENT DOCUMENTS

| | | | |
|---|---|---|---|
| 4,396,933 | 8/1983 | Magdo et al. ............................ | 357/50 |
| 4,814,287 | 3/1989 | Takemoto et al. ....................... | 437/62 |
| 4,974,041 | 11/1990 | Grinberg ................................ | 257/347 |
| 5,055,898 | 10/1991 | Beilstein, Jr. et al. ................ | 357/23.6 |
| 5,145,802 | 9/1992 | Tyson et al. ............................ | 437/63 |
| 5,185,280 | 2/1993 | Houston et al. ........................ | 437/44 |
| 5,215,931 | 6/1993 | Houston .................................. | 437/40 |
| 5,278,102 | 1/1994 | Horie ...................................... | 437/228 |
| 5,296,086 | 3/1994 | Takasu .................................... | 156/610 |
| 5,308,779 | 5/1994 | Saerma ................................... | 437/40 |
| 5,317,181 | 5/1994 | Tyson ..................................... | 257/347 |
| 5,326,991 | 7/1994 | Takasu .................................... | 257/77 |
| 5,405,795 | 4/1995 | Beyer et al. ............................. | 437/41 |
| 5,437,762 | 8/1995 | Ochiai et al. ............................ | 216/20 |
| 5,440,161 | 8/1995 | Iwamatsu et al. ...................... | 257/349 |
| 5,449,642 | 9/1995 | Tan et al. ................................ | 437/200 |
| 5,459,346 | 10/1995 | Asakawa et al. ...................... | 257/347 |
| 5,474,952 | 12/1995 | Fujii ........................................ | 437/63 |
| 5,489,792 | 2/1996 | Hu et al. ................................. | 257/347 |
| 5,518,953 | 5/1996 | Takasu .................................... | 437/106 |
| 5,573,961 | 11/1996 | Hsu et al. ................................ | 437/21 |
| 5,578,509 | 11/1996 | Fujita ...................................... | 437/35 |
| 5,578,865 | 11/1996 | Vu et al. .................................. | 257/611 |
| 5,591,650 | 1/1997 | Hsu et al. ................................ | 437/21 |
| 5,597,739 | 1/1997 | Sumi et al. .............................. | 437/21 |
| 5,612,230 | 3/1997 | Yuzurihara et al. .................... | 437/21 |
| 5,633,182 | 5/1997 | Miyawaki et al. ...................... | 438/30 |
| 5,637,514 | 6/1997 | Jeng et al. .............................. | 438/163 |
| 5,650,340 | 7/1997 | Burr et al. ............................... | 437/30 |
| 5,670,389 | 9/1997 | Huang et al. ........................... | 437/21 |
| 5,681,761 | 10/1997 | Kim ........................................ | 437/21 |
| 5,741,736 | 4/1998 | Orlowski et al. ....................... | 438/286 |
| 5,744,372 | 4/1998 | Bulucea .................................. | 437/34 |
| 5,926,699 | 7/1999 | Kayashi et al. ........................ | 438/164 |

FOREIGN PATENT DOCUMENTS

| | | | |
|---|---|---|---|
| 36 0120547 | 6/1985 | Japan ................................. | 257/349 |
| 40 3032064 | 2/1991 | Japan ................................. | 257/349 |

OTHER PUBLICATIONS

Song et al., "Optimization Study of Halo Doped MOSFETs", Solid–State Electronics, vol. 39, No. 6, 1996, pp. 923–927.

Sanchez et al., "Drain–Engineered Hot–Electron–Resistant Device Structures: A Review", IEEE Transactions on Electron Devices, vol. 36, No. 6, Jun. 1989, pp. 1125–1132.

*Primary Examiner*—Donald L. Monin, Jr.
*Assistant Examiner*—Michael Dietrich
*Attorney, Agent, or Firm*—Myers Bigel Sibley & Sajovec

[57] ABSTRACT

SOI FETs include an electrically insulating substrate, a semiconductor region on the electrically insulating substrate, a field effect transistor having source, drain and channel regions in the semiconductor region and a metal silicide region between the electrically insulating substrate and the semiconductor region. The metal silicide region (e.g., $TiSi_2$) forms non-rectifying junctions with the source and channel regions of the field effect transistor so that holes accumulated in the channel region (upon impact ionization) can be readily transported to the source region (and contact thereto) via the metal silicide layer and recombination of the holes with electrons in the source region can be carried out with high efficiency. The metal silicide region ohmically contacts the source and channel regions, but does not form a junction with the drain region of said field effect transistor.

12 Claims, 3 Drawing Sheets

SEMICONDUCTOR-ON-INSULATOR FIELD EFFECT TRANSISTORS WITH REDUCED FLOATING BODY PARASITICS

FIELD OF THE INVENTION

The present invention relates to semiconductor devices and methods of forming same, and more particularly to semiconductor-on-insulator (SOI) field effect transistors (FETs) and methods of forming semiconductor-on-insulator field effect transistors.

BACKGROUND OF THE INVENTION

Field effect transistors such as MOSFETs fabricated in silicon-on-insulator (SOI) substrates may be susceptible to relatively low source-to-drain breakdown voltages due to floating body effects. In addition, excess holes in nMOSFETs may be generated by impact ionization and may accumulate near the source/body junction therein. A sufficient number of holes may accumulate and forward bias the body with respect to the source and thereby lower the threshold voltage of the MOSFET through the body-bias effect. Furthermore, a "kick" effect in the I–V characteristics may be present because of additional current flow.

Attempts have been made to utilize low barrier body contacts underneath the source region of an SOI transistor to collect current generated by impact ionization. One such attempt is disclosed in U.S. Pat. No. 5,489,792 to Hu. et al. entitled "Silicon-On-Insulator Transistors Having Improved Current Characteristics and Reduced Electrostatic Discharge Susceptibility". In particular, the '792 patent discloses an SOI MOSFET having a P-type channel region and a low barrier P-type body contact region 18 between an N+ source region 16 and a buried silicon dioxide layer 12. Here, the low barrier P-type body contact region 18 forms a P-N junction with the N+ source region 16. Because this P-N junction inhibits conduction directly through the source region, a P+ side contact 20 is formed to provide a current path for impact ionization current. Unfortunately, the inclusion of this P+ side contact 20 increases the unit cell size of an SOI MOSFET and complicates the fabrication process.

Thus, notwithstanding the above-described SOI MOSFET, there continues to be a need for improved SOI-based transistors having reduced susceptibility to parasitic floating body effects and methods of forming same.

SUMMARY OF THE INVENTION

It is therefore an object of the present invention to provide improved semiconductor-on-insulator field effect transistors and methods of forming same.

It is another object of the present invention to provide semiconductor-on-insulator field effect transistors having reduced susceptibility to floating body effects and methods of forming same.

These and other objects, advantages and features of the present invention are provided by semiconductor-on-insulator (SOI) field effect transistors (FETs) which comprise an electrically insulating substrate, a semiconductor region on the electrically insulating substrate, a field effect transistor having source, drain and channel regions in the semiconductor region and a metal silicide region between the electrically insulating substrate and the semiconductor region. The metal silicide region (e.g., $TiSi_2$) forms non-rectifying junctions with the source and channel regions of the field effect transistor so that holes accumulated in the channel region (upon impact ionization) can be readily transported to the source region (and contact thereto) via the metal silicide region and recombination of the holes with electrons in the source region can be carried out with high efficiency.

According to a preferred embodiment of the present invention, the metal silicide region ohmically contacts the source and channel regions, but does not form a junction with the drain region of the field effect transistor. The semiconductor region may also include a chemically-mechanically polished surface thereon and the field effect transistor may comprise an insulated gate electrode on the chemically-mechanically polished surface. According to a preferred aspect of the present invention, a field oxide isolation region is preferably provided between the electrically insulating substrate and the channel region of the field effect transistor, and the metal suicide region is self-aligned to the field oxide isolation region.

According to another embodiment of the present invention, a preferred method of forming a semiconductor-on-insulator field effect transistor comprises the steps of forming a metal silicide layer on a first face of a semiconductor substrate and forming an electrically insulating layer on the metal silicide layer, opposite the first face. A step is then performed to form a field effect transistor having source, drain and channel regions in the semiconductor substrate so that the source and channel regions form non-rectifying junctions with the metal silicide layer. The step of forming a metal silicide layer may be preceded by the step of forming a field oxide isolation region on a first portion of the first face of the semiconductor substrate. The step of forming a metal silicide layer may also comprise the steps of forming a refractory metal layer in contact with a second portion of the first face of the semiconductor substrate and on the field oxide isolation region and then annealing the refractory metal layer to convert a portion of the refractory metal layer to a refractory metal silicide layer. The portion of the refractory metal layer extending opposite the field oxide isolation region is then removed. The step to form the field effect transistor may also be preceded by the steps of bonding a semiconductor wafer to the electrically insulating layer and polishing a second face of the semiconductor substrate.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. In addition, the terms "first conductivity type" and "second conductivity type" refer to opposite conductivity types and each embodiment disclosed herein includes its complementary embodiment. Like numbers refer to like elements throughout.

Figure 1:
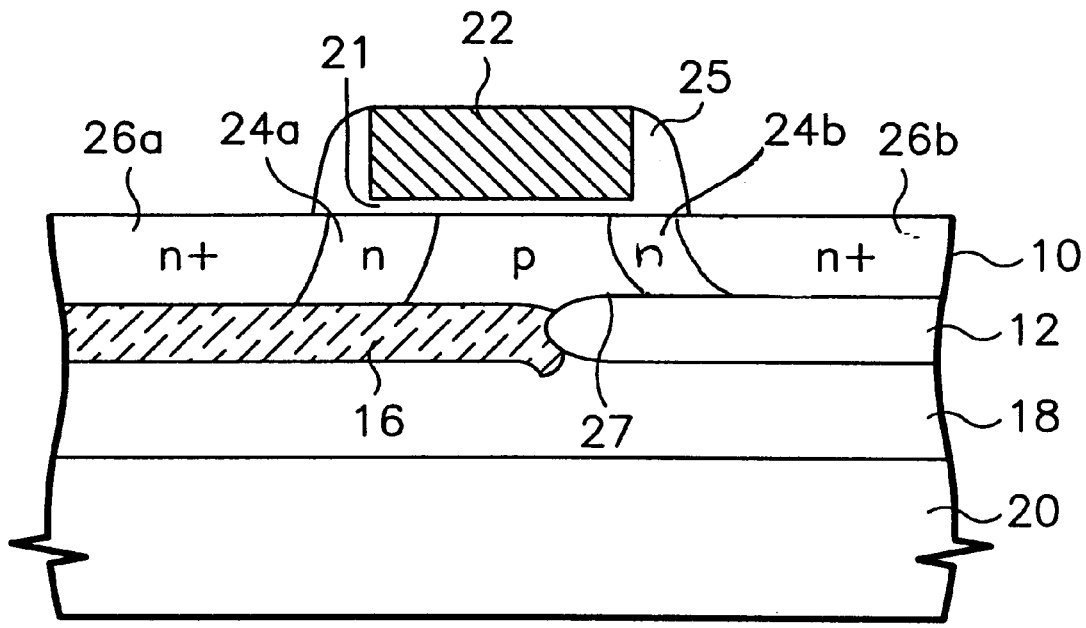
FIG. 1 is a cross-sectional view of a semiconductor-on-insulator field effect transistor according to an embodiment of the present invention.

Referring now to FIG. 1 a preferred semiconductor-on-insulator (SOI) field effect transistor (FET) according to an embodiment of the present invention will be described. In particular, the transistor of FIG. 1 includes a semiconductor substrate 20 having an electrically insulating layer 18 thereon. A monocrystalline silicon layer 10 is also provided and an N-channel metal-oxide-semiconductor field effect transistor (MOSFET) is formed in the silicon layer 10. This MOSFET includes a P-type channel region 27, N-type source and drain regions 24a and 24b which are relatively lightly doped regions (e.g., LDD regions) and N+ source and drain regions 26a and 26b. An insulated gate electrode is also provided on the silicon layer 10, opposite the channel region 27. This insulated gate electrode may include a gate oxide insulating layer 21, a polysilicon gate electrode 22 and sidewall spacers 25. A field oxide isolation region 12 may also be provided between the electrically insulating layer 18 and the channel and drain regions. Moreover, according to a preferred aspect of the present invention, a refractory metal silicide layer 16 (e.g., $TiSi_2$) is provided between the electrically insulating layer 18 and the channel and source regions, as illustrated. In particular, the metal silicide layer 16 forms non-rectifying junctions with the source regions 24a and 26a and the channel region 27 of the MOSFET, so that holes accumulated in the channel region 27 (upon impact ionization) can be readily transported to the N+ source region 26a and contact thereto (not shown) via the metal silicide layer 16 and recombination of the holes with electrons in the N+ source region 26a can be carried out with high efficiency. Here, the metal silicide layer 16 ohmically contacts the source and channel regions, but does not form a junction with the drain region of the MOSFET. As described more fully hereinbelow with respect to FIGS. 2A–2E, the metal silicide layer 16 may be self-aligned to the field oxide isolation region 12.

Figure 2A:
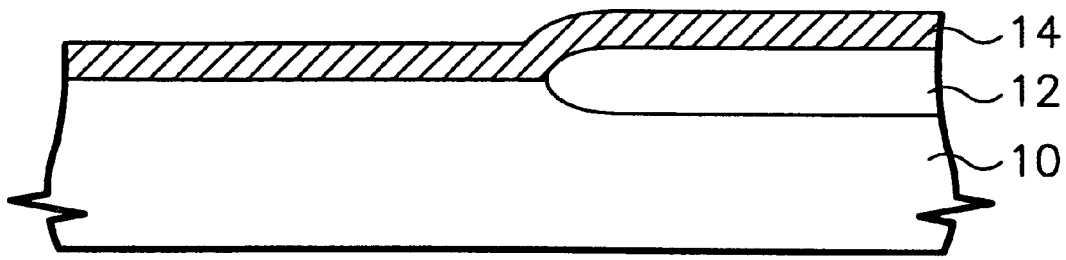
FIGS. 2A–2E are cross-sectional views of intermediate structures which illustrate a preferred method of forming the transistor of FIG. 1, according to an embodiment of the present invention.

Referring now to FIGS. 2A–2E, preferred methods of forming the SOI MOSFET of FIG. 1 will be described. As illustrated by FIG. 2A, a field oxide isolation region 12 is selectively formed adjacent a first portion of a first face of a semiconductor substrate 10 (e.g., monocrystalline silicon substrate). This field oxide isolation region 12 may be formed using a conventional local oxidation of silicon (LOCOS) technique. A refractory metal layer 14 comprising a material such as titanium (Ti) is then deposited on a second portion of the first face of the semiconductor substrate 12 and on the field oxide isolation region 12, as illustrated. An annealing step is then performed to convert the portion of the refractory metal layer 14 in contact with the semiconductor substrate 12 to a refractory metal silicide region (e.g., $TiSi_2$). During this annealing step, silicon atoms from the semiconductor substrate diffuse and react with the refractory metal atoms to form a metal silicide region, however, the portion of the metal layer 14 in contact with the field oxide isolation region 12 typically remains unreacted because an available source of free silicon atoms is typically not present in the field oxide isolation region 12.

Figure 2B:
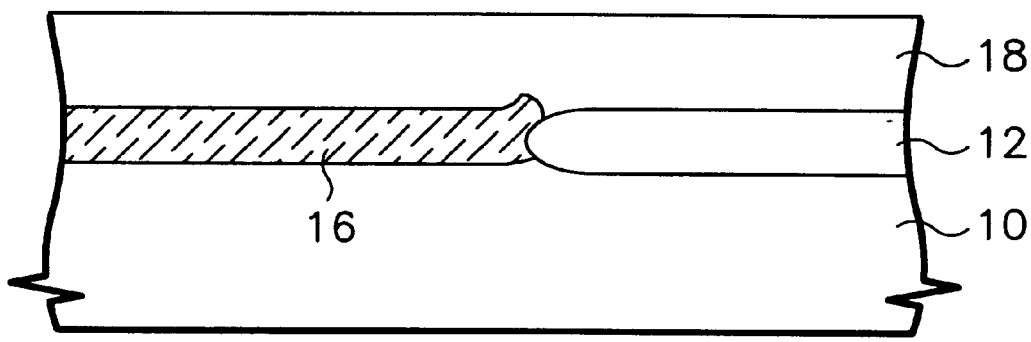
Figure 2C:
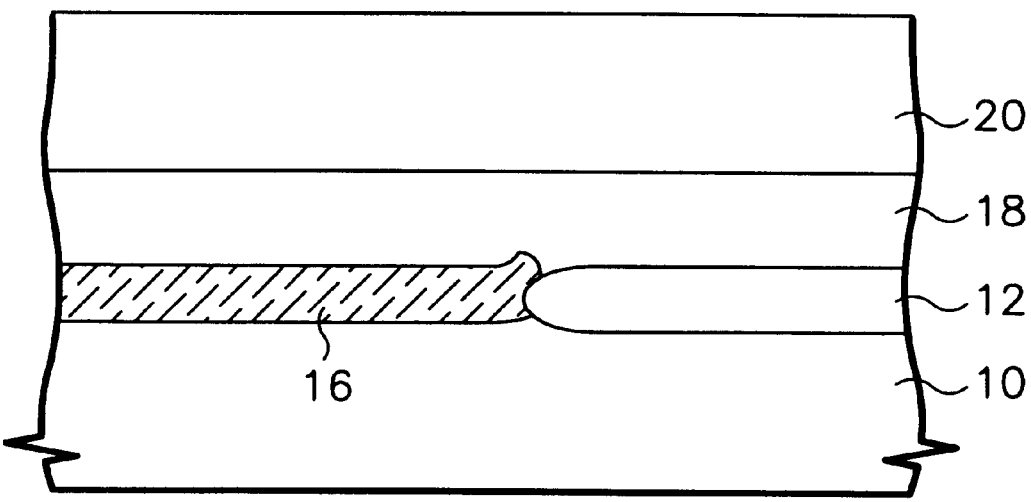

Next, as illustrated by FIG. 2B, the unreacted portion of the refractory metal layer 14 is then removed using a conventional etching technique, to define a refractory metal silicide region 16 which is self-aligned to the field oxide isolation region 12. Next, an electrically insulating layer 18, such as a low temperature oxide (LTO) layer, is formed on the refractory metal silicide region 16 and on the field oxide isolation region 12. A polishing step may also be performed to planarize the electrically insulating layer 18. Next, as illustrated by FIG. 2C, a reverse wafer bonding technique is performed to bond a semiconductor wafer 20 to the electrically insulating layer 18. An annealing step may also be performed at low temperature to inhibit degradation of the refractory metal silicide region 16. A chemical-mechanical polishing (CMP) step is then performed to thin the semiconductor substrate 10 to a desired thickness (to form a silicon layer 10) and planarize a second surface thereon.

Figure 2D:
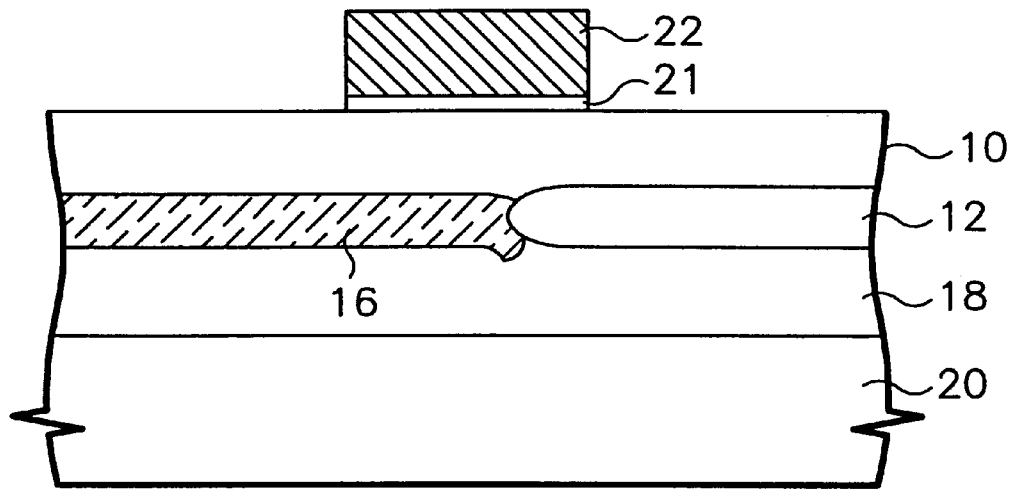
Figure 2E:
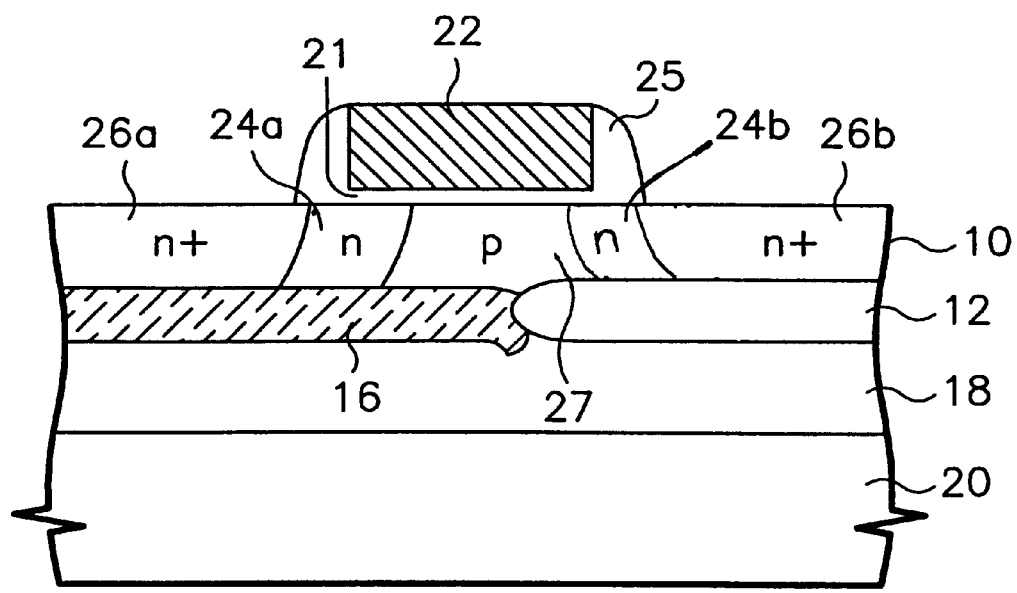

Referring now to FIG. 2D, the silicon layer 10 may be doped with P-type dopants by performing a blanket ion implant into the polished second surface of the silicon layer 10. Next, a gate oxide layer 21 and polysilicon conductive layer 22 are formed in sequence on the second surface of the silicon layer 10. The gate oxide layer and polysilicon conductive layer are then patterned to define an insulated gate electrode. Next, as illustrated by FIG. 2E, the gate electrode 22 may be used as a mask during the step of implanting N-type dopants into the silicon layer 10. A relatively short duration annealing step may also be performed to drive-in and diffuse the implanted dopants and define lightly doped source and drain regions 24a and 24b, respectively. Electrically insulating spacers 25 may then be formed on the exposed sidewalls of the gate electrode 22, using conventional techniques. Next, N-type dopants are again implanted (e.g., at a higher dose level) into the silicon layer 10 to define more highly doped source and drain regions 26a and 26b which are self-aligned to the insulating spacers 25.

As determined by the inventor herein, the refractory metal silicide layer 16 provides a highly conductive current path so that holes (generated by impact ionization) accumulated in the channel region 27 can be swept to the N+ source region 26a. Here, an ohmic contact is formed between the silicide layer 16 and the source regions 24a, 26a and a part of the channel region 27. Because any potential barrier formed between the silicide layer 16 and the channel region 27 is lower than the P-N junction barrier between the channel region 27 and the lightly doped source region 24a, holes accumulated in the channel region 27 may be readily swept to the N+ source region 26a via the silicide layer 16. Therefore, the rate of recombination of the accumulated holes with electrons in the source region 26a can be carried out with high efficiency.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor-on-insulator field effect transistor, comprising:
   an electrically insulating substrate;
   a semiconductor region on said electrically insulating substrate;
   a field effect transistor having source, drain and channel regions in said semiconductor region; and
   a metal silicide region between said electrically insulating substrate and said semiconductor region and forming a junction with the source and channel regions of said field effect transistor.

2. The transistor of claim 1, wherein said metal silicide region ohmically contacts the source and channel regions, but does not form a junction with the drain region of said field effect transistor.

3. The transistor of claim 1, wherein said semiconductor region comprises a semiconductor region having a chemically-mechanically polished surface thereon; and wherein said field effect transistor comprises an insulated gate electrode on the chemically-mechanically polished surface.

4. The transistor of claim 2, wherein said metal silicide region comprises titanium disilicide.

5. The transistor of claim 2, further comprising a field oxide isolation region between said electrically insulating substrate and the channel region of said field effect transistor.

6. The transistor of claim 5, wherein said metal silicide region is self-aligned to said field oxide isolation region.

7. A silicon-on-insulator field effect transistor, comprising:
   an electrically insulating substrate;
   a silicon layer on said electrically insulating substrate;
   a field effect transistor having source, drain and channel regions in said silicon layer; and
   an electrically conductive layer between said electrically insulating substrate and said silicon layer and forming respective non-rectifying junctions with the source and channel regions of said field effect transistor.

8. The transistor of claim 7, wherein said electrically conductive layer comprises a refractory metal silicide and ohmically contacts the source and channel regions, but does not form a junction with the drain region of said field effect transistor.

9. The transistor of claim 7, wherein said semiconductor region comprises a semiconductor region having a chemically-mechanically polished surface thereon; and wherein said field effect transistor comprises an insulated gate electrode on the chemically-mechanically polished surface.

10. The transistor of claim 8, wherein said electrically conductive layer comprises titanium disilicide.

11. The transistor of claim 8, further comprising a field oxide isolation region between said electrically insulating substrate and the drain and channel regions of said field effect transistor.

12. The transistor of claim 11, wherein said electrically conductive layer is self-aligned to said field oxide isolation region.

* * * * *